(12) United States Patent
Senturk

(10) Patent No.: US 11,476,686 B2
(45) Date of Patent: Oct. 18, 2022

(54) SAFETY INTERLOCK

(71) Applicant: ABB Schweiz AG, Baden (CH)

(72) Inventor: Osman Senturk, The Hague (NL)

(73) Assignee: ABB SCHWEIZ AG, Baden (CH)

(*) Notice: Subject to any disclaimer, the term of this patent is extended or adjusted under 35 U.S.C. 154(b) by 401 days.

(21) Appl. No.: 16/659,086

(22) Filed: Oct. 21, 2019

(65) Prior Publication Data

US 2020/0052505 A1 Feb. 13, 2020

Related U.S. Application Data

(63) Continuation of application No. PCT/EP2018/059857, filed on Apr. 18, 2018.

(30) Foreign Application Priority Data

Apr. 20, 2017 (EP) .................................. 17167213

(51) Int. Cl.
*H02J 7/00* (2006.01)
*B60L 53/67* (2019.01)
(Continued)

(52) U.S. Cl.
CPC .............. *H02J 7/0029* (2013.01); *B60L 3/04* (2013.01); *B60L 53/14* (2019.02); *B60L 53/67* (2019.02);
(Continued)

(58) Field of Classification Search
CPC .................................................. H02J 7/0029
(Continued)

(56) References Cited

U.S. PATENT DOCUMENTS 9,524,838 B2 12/2016 Nolewaika
9,755,417 B2 9/2017 Siciak et al.
(Continued)

FOREIGN PATENT DOCUMENTS

DE 102011003518 A1 8/2012
DE 102015204028 A1 9/2015
(Continued)

OTHER PUBLICATIONS

European Patent Office, International Search Report & Written Opinion issued in corresponding Application No. PCT/EP2018/059857, dated Jun. 12, 2018, 16 pp.
(Continued)

*Primary Examiner* — Eric D Lee
(74) *Attorney, Agent, or Firm* — Greenberg Traurig, LLP

(57) ABSTRACT

The application relates to a charging system, including a number of m chargers each adapted for providing electrical energy to charge an electrical vehicle, whereby m is an integer and m≥1, a number of n outlet ports each adapted for electrically connecting the electrical vehicle, whereby n is an integer and n≥2, and a switchable connection matrix device including a number of n outlet port switches each adapted for electrically connecting at least one of the m chargers to one of the n outlet ports and, if m>1, a number of m−1 charger switches each adapted for electrically connecting two of the m chargers, whereby the switchable connection matrix device is adapted for detecting a short-circuit between at least two outlet ports and/or for generating a fault signal if the short-circuit between at least two outlet ports is detected.

20 Claims, 3 Drawing Sheets

(51) Int. Cl.
*B60L 53/14* (2019.01)
*H02H 1/00* (2006.01)
*H02H 3/08* (2006.01)
*B60L 3/04* (2006.01)
*H03K 19/20* (2006.01)

(52) U.S. Cl.
CPC ............ *H02H 1/0007* (2013.01); *H02H 3/08* (2013.01); *H02J 7/0013* (2013.01); *H02J 7/0031* (2013.01); *H03K 19/20* (2013.01)

(58) Field of Classification Search
USPC ........................................................ 320/109
See application file for complete search history.

(56) References Cited

U.S. PATENT DOCUMENTS

| | | | |
|---|---|---|---|
| 2004/0189251 A1 | 9/2004 | Kutkut et al. | |
| 2013/0187602 A1* | 7/2013 | Bouman | B60L 53/20 320/109 |
| 2015/0115891 A1 | 4/2015 | Sung et al. | |

FOREIGN PATENT DOCUMENTS

| | | |
|---|---|---|
| EP | 1401078 A1 | 3/2004 |
| EP | 2492133 A2 | 8/2012 |
| EP | 2572431 B1 | 8/2014 |
| GB | 2479418 A | 10/2011 |
| JP | 3214044 B2 | 10/2001 |
| JP | 2011239559 A | 11/2011 |
| JP | 2012210039 A | 10/2012 |
| JP | 2016201993 A | 12/2016 |
| WO | 2013137501 A1 | 9/2013 |
| WO | 2014184729 A2 | 11/2014 |

OTHER PUBLICATIONS

Anonymous, "Schultz (Shalter")", Wikipedia, Dec. 26, 2016, Retrieved from the Internet Jul. 20, 2017: https://de.wikipedia.org/wiki/schutz_(schalter).

Anonymous, "Elementarrelais und funktionale Sicherheit, Relais aktuell, gemeinsame Website der Deutschen Schaltrelaishersteller im ZVEI,"Nov. 4, 2014, Retrieved from the Internet on Oct. 20, 2017: http://www.schaltrelais.de/2014-elementarrelais-funktionale-sicherheit.htm.

* cited by examiner

SAFETY INTERLOCK

TECHNICAL FIELD

The invention relates to a charging system, comprising a number of chargers each adapted for providing electrical energy to charge an electrical vehicle and a number of outlet ports each adapted for electrically connecting the electrical vehicle.

BACKGROUND ART

Electric vehicle chargers are normally designed to charge a single electric vehicle such as an electric bus, ebus, at a time. Thus, often only a single charging outlet respectively a single pole is installed. If multiple outlets are provided each outlet is dedicated to a specific charging standard such as for example CHAdeMO or CCS. However, instantaneous charging of multiple electrical vehicles via these outlets is not possible.

JP 2012210039 A describes a power distribution device disposed on the site of a commercial facility and the like including plural site-battery units, a distributor, and plural charging poles.

Prior art chargers support either single outlet/standard or multiple outlets/standards, but without such instantaneous charging feature. Specifically, prior art lacks solutions for implementing secure and convenient multi-pole instantaneous charging. The critical aspect of all solutions is that the electrical vehicle charger must avoid battery short-circuits between the electrical vehicles connected to the charger outlets.

Prior art solutions address this problem by programming charger controllers to steer the contactors and/or switches accordingly. However, proper operation of a charger controller is not guaranteed under special conditions such as software bugs, EMI, etc. On the other hand, consequences of such failures are detrimental as they include possible damages to the electric cars and the chargers.

SUMMARY OF INVENTION

It is therefore an object of the invention to provide a safety interlock mechanism for multi-pole electric car chargers such that the interlock forces the charging system to shut down if a forbidden contactor state occurs.

The object of the invention is solved by the features of the independent claims. Preferred embodiments are defined by the dependent claims.

Thus, the object is solved by a charging system, comprising a number of m chargers each adapted for providing electrical energy to charge an electrical vehicle, whereby m is an integer and m≥1, a number of n outlet ports each adapted for electrically connecting the electrical vehicle, whereby n is an integer and n≥2, and a switchable connection matrix device comprising a number of preferably n outlet port switches each adapted for electrically connecting at least one of the m chargers to one of the preferably n outlet ports and, if m>1, a number of preferably m−1 charger switches each adapted for electrically connecting at least two of the preferably m chargers, whereby the switchable connection matrix device is adapted for detecting a short-circuit between at least two outlet ports and/or for generating a fault signal if the short-circuit between at least two outlet ports is detected.

A key point of the invention is that the switchable connection matrix device is adapted for detecting a short circuit between at least two outlet ports. In such case, as per the second alternative, the fault signal is generated, according to which the charging system can be forced to shut down. Thus, the invention provides an instantaneous charging possibility for charging multiple electric vehicles at the same time, which brings great flexibility to a charging system in terms of capacity usage, increased functionality and significantly increased safety. In other words, the invention allows avoiding battery short-circuits between electrical vehicles connected to the charger outlet ports of the charging system.

The chargers are preferably provided as DC chargers with, for example, 50 kW DC fast charging capability thus allowing a typical charging of 30 to 80% in 15 minutes at an output voltage of 200-500 V at 125 A (Combo-1) or 50-500 Vat 120 A (CHAdeMO) and/or may fulfil EN61851-23/DIN 70121 Combo-1 and/or CHAdeMO 1.0 DC connection standards for the outlet ports. In an exemplary embodiment, the charging system comprises three chargers (m=3) and four outlet ports (n=4) such that two charger switches (m−1) and four outlet port switches (n) are provided. In such case each two of the outlet ports and respective outlet port switches can be connected in parallel to each one charger, whereby the third charger can be connected via the two charger switches to both other chargers thereby connecting the chargers in parallel. In normal operation, one electric vehicle connected to one of the outlet ports is charged with electrical energy once the respective outlet port switch is switched on for connecting the electrical vehicle with the respective charger. Further, chargers can be connected to the electric vehicle by switching the respective charger switches on.

The charger switches and/or the outlet port switches are preferably adapted for disconnecting the charger and/or the outlet port in case the short-circuit is detected and/or the fault signal is generated. Preferably two outlet ports and respective two outlet port switches are connected in parallel to a respective charger. A short-circuit means for example an electrical connection between two charge ports and/or between two associated electric vehicles and/or their batteries. The electric vehicle can be provided as any electric vehicle known from prior art, for example as an electric bus, ebus, and comprises a battery to be charged by the charging system. The fault signal can be send to a computer network for further processing, may trigger an alarm or the like.

According to a further preferred embodiment, the switchable connection matrix device is adapted, if the short-circuit is detected and/or the fault signal is generated, to open at least one of the outlet port switches and/or the charger switches for clearing the short-circuit, to disconnect at least one charger and/or at least one outlet port and/or to shut-down the charging system. In case a short-circuit occurs, which may damage the batteries of the connected electric vehicles, the switchable connection matrix device may advantageously disconnect at least one respective electric vehicle by switching off a respective charger switch and/or outlet port switch thereby resolving the short-circuit. Preferably, only one electric vehicle is disconnected such that the remaining electric vehicles connected to the charging system can be continuously charged.

According to a preferred embodiment, the switchable connection matrix device comprises a number of electrical switch state check devices each adapted for determining the switching status of one of the outlet port switches and/or of the charger switches and whereby the short-circuit is detected and/or the fault signal is generated based on the determined switching status. The switch state check devices can be provided as a mechanical and/or electrical device, for example as a photodiode, for determining the switching status of the respective outlet port switch and/or charger switch. Preferably a number of n+m−1 electrical switch state check devices are provided such that each outlet port switch and charger switch is provided with such device. Such embodiment allows an easy and cost-effective implementation for the switching status determination.

According to another preferred embodiment, the outlet port switches and the charger switches are each controllable by a switching signal and whereby the short-circuit is detected and/or the fault signal is generated based on the switching signals. This way the switching status is not mechanically detected. Instead the switching signal is used a as basis for determining the switching status of the outlet port switch and/or charger switch for detecting if a short circuit occurs.

According to another preferred embodiment, the switchable connection matrix device comprises at least one logic device whose input side is connected to the outlet port switches and the charger switches and whose output side generates the fault signal if the short-circuit is detected. Preferably the input side is connected to all n outlet port switches and all m−1 charger switches. The input side of the logic device is preferably connected to all switch state check devices for obtaining the respective switching status. The logic is device preferably comprises a logic which, based on the determined switching status, determines the fault signal if a short-circuit occurs.

Generally, the logic device can be provided as any logic means known from prior art. However, according to another preferred embodiment, the logic device is provided as a logic gate, as a programmable logic array and/or as a programmable logic controller. A logic gate is a physical device implementing a boolean function performing a logical operation on one or more logical inputs, and produces a logical output. A programmable logic array (PLA) is a kind of programmable logic device to implement combinational logic circuits. The PLA often comprises a set of programmable AND gate planes, which link to a set of programmable OR gate planes, which can then be conditionally complemented to produce the logical output. A programmable logic controller (PLC) is preferably provided as a "hard" real-time system whereby output results are produced in response to input conditions within a limited time. With such logic gate, programmable logic array and/or programmable logic controller and the determined switching status as logical inputs, it can be conveniently determined if a short-circuit occurs in that case resulting in the fault signal as logical output. According to a further preferred embodiment, the logic device comprises an OR, AND, NOR and/or NOR logic gate.

According to another preferred embodiment, n is ≥4, n is an even number and the outlet ports are provided as a multi-pole charging connection with each two outlet ports combined together as one pole. Such embodiment allows a comfortable implementation with two outlet ports per pole. The charging system and/or the charger may further comprise a power converter for converting AC power from a power source such as an AC grid to suitable DC format for charging the electric vehicle.

According to a further preferred embodiment, m is >3 and the m−1 charger switches are adapted for electrically connecting the m chargers in parallel. Connecting two or more chargers in parallel increases the electrical charging power such that the electric vehicle becomes charged in shorter time. An electric vehicle (EV), also referred to as an electric drive vehicle, uses one or more electric motors or traction motors for propulsion. EVs may include road and rail vehicles, surface and underwater vessels, electric aircraft and electric spacecraft.

According to another preferred embodiment, the switchable connection matrix device is adapted, if the short-circuit is detected and/or the fault signal is generated, to open at least one of the outlet port switches and/or the charger switches for clearing the short-circuit. In this way it can be prevented that a battery of the electric vehicle is damaged. For example, if a plurality of electric vehicles are charged at the same time by using a plurality of charger and if connecting one additional electrical vehicle to the charging system results in a short-circuit then only opening the outlet port switch and/or the charger switch directly associated to charging the additional electrical vehicle could be sufficient for clearing the short-circuit. In the example this could be outlet port switch and/or the charger switch closed for starting charging of the additional electrical vehicle. The term opening respectively closing means that the electrical connection by said switch is interrupted respectively established.

Generally, the outlet-port switch and/or the charger switch can be provided as any switching means known from prior art. According to a preferred embodiment, the number of outlet port switches and/or the number of charger switches are provided as contactors. Preferably each outlet port switch and/or each charger switch is provided as a contactor or comprises two contactors. A contactor is an electrically controlled switch for switching an electrical power circuit and is normally controlled by a circuit which has a lower power level than the switched circuit. The electrical switch state check device can be integrated into the contactor for determining the switching status. The switching signal can be obtained from the circuit controlling the contactor.

The object is further solved by a safety interlock arrangement, comprising at least two charging systems as described before and an interlock device connected to the switchable connection matrix devices and adapted for receiving the fault signal from the switchable connection matrix devices. The interlock device thus may centrally control occurrence of short-circuits of multiple charging systems being installed at geographically different locations. The interlock device may comprise and/or can be connected to computer network and/or may comprise a screen for depicting the geographical occurrence of short-circuits.

According to a preferred embodiment, the safety interlock arrangement comprises at least one, for example two or three, electrical vehicle and/or an ebus electrically connected to the charge port for charging the electrical vehicle and/or the ebus. Preferably, the electrical vehicle and/or the ebus are electrically connected to the charge port by a cable and/or connector for easily establishing the electrical connection to the battery of the electrical vehicle and/or the ebus.

BRIEF DESCRIPTION OF DRAWINGS

These and other aspects of the invention will be apparent from and elucidated with reference to the embodiments described hereinafter.

In the drawings.

DESCRIPTION OF EMBODIMENTS

Figure 1:
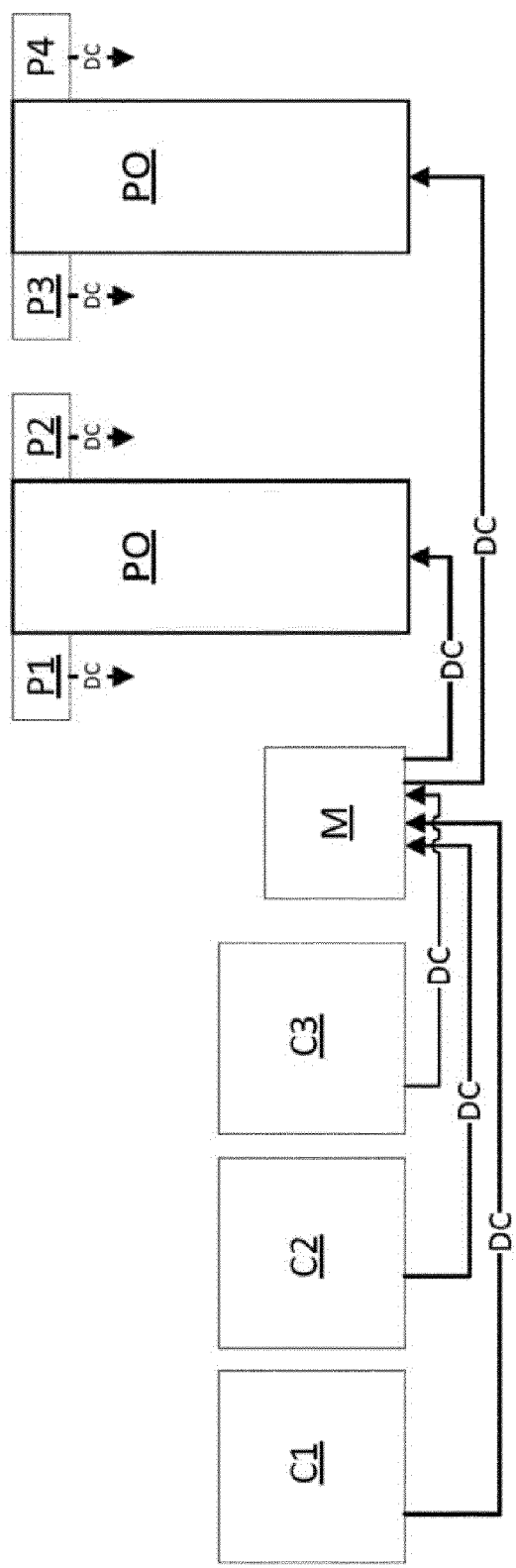
FIG. 1 shows a charging system according to a preferred embodiment of the invention as block diagram.
Figure 2:
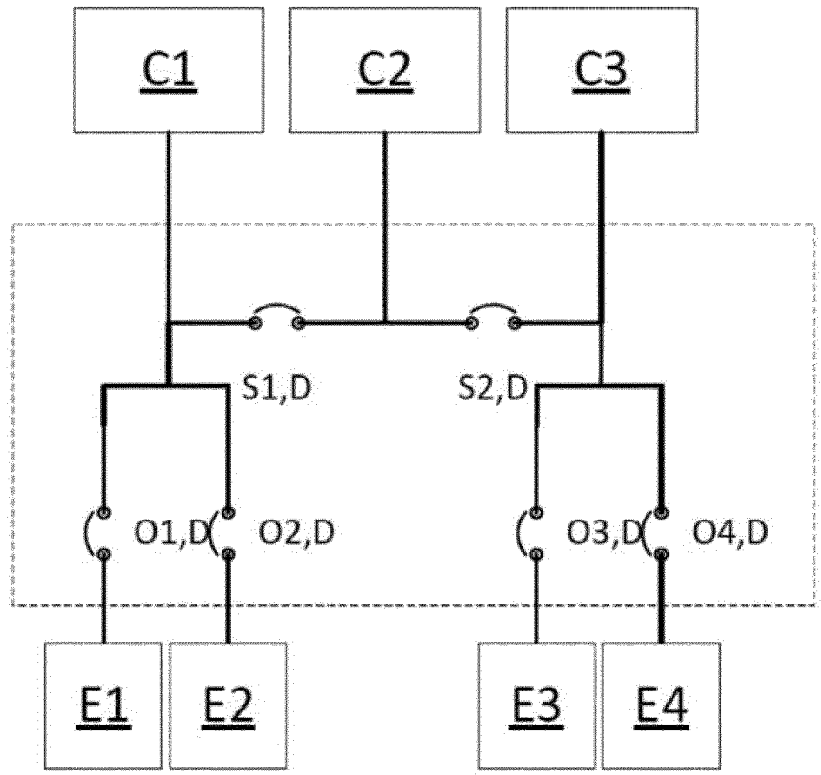
FIG. 2 shows the charging system according to the preferred embodiment of the invention as single-line diagram, FIG. 3 a switchable connection matrix device of the charging system according to the preferred embodiment of the invention, FIG. 4 a further switchable connection matrix device of the charging system according to the preferred embodiment of the invention, and FIG. 5 an exemplary implementation of the preferred embodiment in a schematic view.

FIGS. 1 to 2 each show a charging system according to a preferred embodiment of the invention in FIG. 1 as block diagram and in FIG. 2 as single-line diagram. The charging system comprises a number m of chargers C1, C2, C3, namely m=3 chargers C1, C2, C3, which are each adapted for providing electrical energy to charge an electrical vehicle E1, E2, E3, E4. Beside that any other number m of chargers C1, C2, C3 could be used as long as m is an integer and m≥1.

The chargers C1, C2, C3 are each provided as DC chargers with 50 kW DC fast charging capabilities thus allowing a typical charging of 30 to 80% in 15 minutes at an output voltage of 200-500 V at 125 A (Combo-1) or 50-500 V at 120 A (CHAdeMO), whereby the chargers C1, C2 and C3 fulfil EN61851-23/DIN 70121 Combo-1 norms and CHAdeMO 1.0 DC connection standards for respective outlet ports P1, P2, P3, P4. As can be seen from FIGS. 1 and 2, a number n=4 outlet ports P1, P2, P3, P4 are provided, which are each adapted for electrically connecting one electrical vehicle E1, E2, E3, E4, whereby the figure n is an integer and n≥2. Each two outlet ports P1, P2, P3, P4 are combined together as a pole PO1, PO2.

The charging system further comprises a switchable connection matrix device M for electrically connecting the chargers C1, C2, C3 with the outlet ports P1, P2, P3, P4 respectively the electrical vehicles E1, E2, E3, E4. The switchable connection matrix device M comprises a number of n=4 outlet port switches O1, O2, O3, O4, whereby each outlet port switch O1, O2, O3, O4 is adapted for electrically connecting at least one of the m chargers C1, C2, C3 to one of the four outlet ports P1, P2, P3, P4. Further, in case m is greater than 1, which is fulfilled in the present embodiment, the switchable connection matrix device M further comprises a number of m−1=2 charger switches S1, S2, which are each adapted for electrically connecting two of the three chargers C1, C2, C3 in parallel. Each two outlet port switches O1, O2, O3, O4 are combined into a pole PO.

The four outlet port switches O1, O2, O3, O4 and the two charger switches S1, S2 are each provided as contactors. In the embodiment as shown in FIG. 2, first outlet port switches O1 and second outlet port switch O2 are connected in parallel as well as third outlet port switches O3 and fourth outlet port switch O4 are. Thus, first electric vehicle E1 and second electric vehicle E2 can never be charged instantaneously, because this would causes short-circuits between the batteries of the first electric vehicle E1 and second electric vehicle E2. Thus, either first outlet port switches O1 must be open or second outlet port switch O2 must be open at a time for avoiding a short-circuit. Neither can the third electric vehicle E1 and the fourth electric vehicle E2 charged at a time. In case the first charger switch S1 and the second charger switch S2 are closed then only one electric vehicle E1, E2, E3, E4 can be charged at a time. Otherwise, there will be a risk of short circuit between the batteries of electric vehicles E1, E2, E3, E4.

Thus, for avoiding such short circuit the switchable connection matrix device M is adapted for detecting the short-circuit between at least two outlet ports P1, P2, P3, P4 and/or for generating a fault signal if the short-circuit between at least two outlet ports P1, P2, P3, P4 is detected. In other words, the switchable connection matrix device M is adapted for initiating the fault signal in case any forbidden state of the contactors is detected such that any possible short-circuit between the batteries of electric vehicles E1, E2, E3, E4 is avoided. In such case i.e. if a short-circuit is detected and/or if the fault signal is generated, the switchable connection matrix device M opens at least one of the outlet port switches O1, O2, O3, O4 and/or the charger switches S1, S2 for clearing the short-circuit, disconnects at least one charger C1, C2, C3 and/or shuts-down the charging system.

Figure 3:
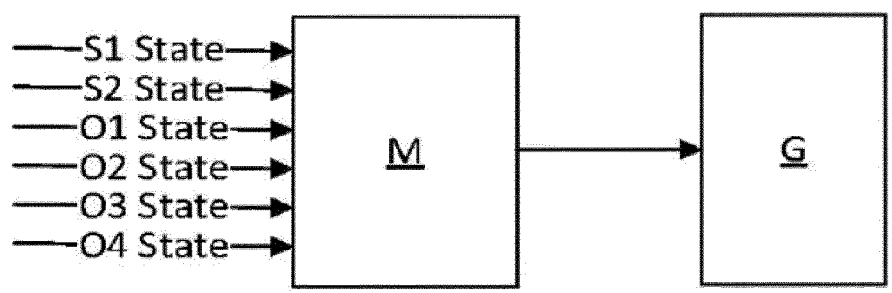
Figure 4:
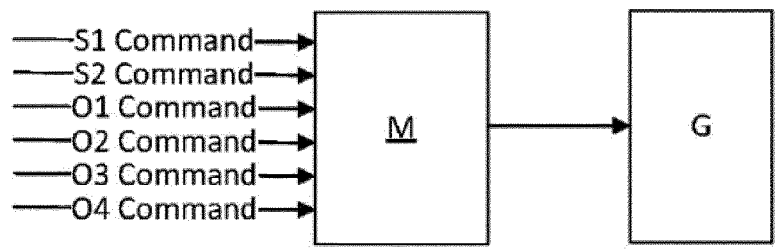

Specifically, for determining the switching status of the outlet port switches O1, O2, O3, O4 and of charger switches S1, S2, as shown in FIG. 3, the switchable connection matrix device M comprises a number of electrical switch state check devices D, which are provided as photodiodes and are installed at each of the outlet port switches O1, O2, O3, O4 and at each of the charger switches S1, S2. Alternatively or in addition, as shown in FIG. 4, a switching signal for switching the outlet port switches O1, O2, O3, O4 and the charger switches S1, S2 can be used to detect the short-circuit and/or to generate the fault signal.

Figure 5:
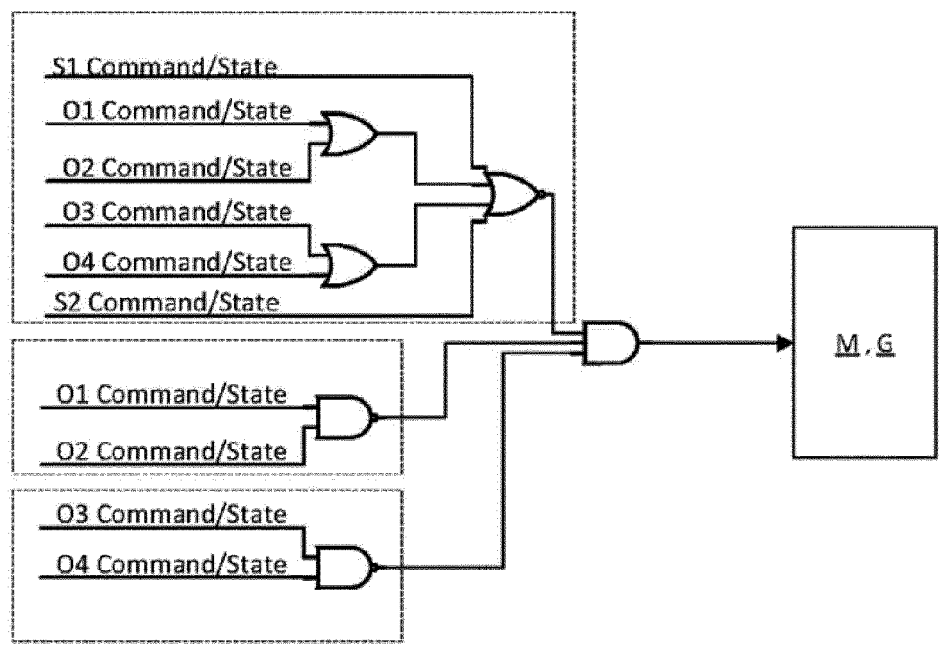

With the determining switching status and/or the switching signal as input signal to a logic device L, as shown in FIG. 5, the logic device L is configured to generate the fault signal if the short-circuit is detected on its output side. In this way, the switchable connection matrix device M comprises at least one logic device L whose input side is connected to the outlet port switches O1, O2, O3, O4 and the charger switches S1, S2. The logic device L can be provided as a logic gate, as a programmable logic array and/or as a programmable logic controller. As can be seen from FIG. 5, the logic device L comprises a number of OR, AND, NOR and/or NOR logic gates.

The invention further encompasses a safety interlock arrangement, not shown, which comprises at least two charging systems as described before and an interlock device G connected to the switchable connection matrix devices M. In this way the interlock device G is adapted for receiving the fault signal from the switchable connection matrix devices M.

While the invention has been illustrated and described in detail in the drawings and foregoing description, such illustration and description are to be considered illustrative or exemplary and not restrictive; the invention is not limited to the disclosed embodiments. Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

REFERENCE SIGNS LIST

C1, C2, C3 charger
E1, E2, E3, E4 electrical vehicle
P1, P2, P3, P4 outlet port
M switchable connection matrix device
O1, O2, O3, O4 outlet port switch S1, S2 charger switch
D switch state check device
L logic device
PO pole
G interlock device

The invention claimed is:

1. A charging system, comprising:
a number of m chargers each adapted for providing electrical energy to charge an electrical vehicle, wherein m is an integer and m≥1,
a number of n outlet ports each adapted for electrically connecting the electrical vehicle, wherein n is an integer and n≥2, and
a switchable connection matrix device comprising a number of outlet port switches each adapted for electrically connecting at least one of the m chargers to one of the outlet ports and, if m>1, a number of charger switches each adapted for electrically connecting at least two of the m chargers, wherein
the switchable connection matrix device is adapted for detecting a short-circuit between at least two outlet ports and/or for generating a fault signal if the short-circuit between at least two outlet ports is detected, and
the outlet port switches and the charger switches are each controllable by a switching signal and wherein the short-circuit is detected and/or the fault signal is generated based on the switching signal.

2. The charging system according to claim 1,
wherein the switchable connection matrix device comprises a number of n outlet port switches each adapted for electrically connecting at least one of the m chargers to one of the n outlet ports and, if m>1, a number of m−1 charger switches each adapted for electrically connecting at least two of the m chargers.

3. The charging system according to claim 2,
wherein the switchable connection matrix device is adapted, if the short-circuit is detected and/or the fault signal is generated, to open at least one of the outlet port switches and/or the charger switches for clearing the short-circuit, to disconnect at least one charger and/or to shut-down the charging system.

4. The charging system according to claim 3,
wherein a generator comprises a main machine and an exciter comprises a field wound or brushless rotor for exciting the main machine.

5. The charging system according to claim 3,
wherein the switchable connection matrix device comprises at least one logic device whose input side is connected to the outlet port switches and the charger switches and whose output side generates the fault signal if the short-circuit is detected.

6. The charging system according to claim 2,
wherein a generator comprises a main machine and an exciter comprises a field wound or brushless rotor for exciting the main machine.

7. The charging system according to claim 2,
wherein the switchable connection matrix device comprises at least one logic device whose input side is connected to the outlet port switches and the charger switches and whose output side generates the fault signal if the short-circuit is detected.

8. The charging system according to claim 2,
wherein n≥4, n being an even number and the outlet ports are provided as a multi-pole charging connection with each two outlet ports combined together as one pole.

9. The charging system according to claim 1,
wherein the switchable connection matrix device comprises a number of electrical switch state check devices each adapted for determining the switching status of one of the outlet port switches and/or charger switches and wherein the short-circuit is detected and/or the fault signal is generated based on the determined switching status.

10. The charging system according to claim 9,
wherein the switchable connection matrix device comprises at least one logic device whose input side is connected to the outlet port switches and the charger switches and whose output side generates the fault signal if the short-circuit is detected.

11. The charging system according to claim 1,
wherein the switchable connection matrix device comprises at least one logic device whose input side is connected to the outlet port switches and the charger switches and whose output side generates the fault signal if the short-circuit is detected.

12. The charging system according to claim 11,
wherein the logic device is provided as a logic gate, as a programmable logic array and/or as a programmable logic controller.

13. The charging system according to claim 12,
wherein the logic device comprises an OR, AND, NOR and/or NOR logic gate.

14. The charging system according to claim 13,
wherein n≥4, n being an even number and the outlet ports are provided as a multi-pole charging connection with each two outlet ports combined together as one pole.

15. The charging system according to claim 1,
wherein n≥4, n being an even number and the outlet ports are provided as a multi-pole charging connection with each two outlet ports combined together as one pole.

16. The charging system according to claim 15,
wherein m>3 and the charger switches are adapted for electrically connecting the m chargers in parallel.

17. The charging system according to claim 1,
wherein m>3 and the charger switches are adapted for electrically connecting the m chargers in parallel.

18. The charging system according to claim 1,
wherein the number of outlet port switches and/or the number of charger switches are provided as contactors.

19. A safety interlock arrangement, comprising at least two charging systems according to claim 1 and an interlock device connected to the switchable connection matrix devices and adapted for receiving the fault signal from the switchable connection matrix devices.

20. The safety interlock arrangement according to claim 19, comprising at least one electrical vehicle and/or an ebus electrically connected to a charge port for charging the electrical vehicle and/or the ebus.

* * * * *